United States Patent [19]

Mitchell et al.

[11] Patent Number: 5,120,672

[45] Date of Patent: Jun. 9, 1992

[54] FABRICATING A SINGLE LEVEL MERGED EEPROM CELL HAVING AN ONO MEMORY STACK SUBSTANTIALLY SPACED FROM THE SOURCE REGION

[75] Inventors: Allan T. Mitchell, Garland; Bert R. Riemenschneider, Murphy, both of Tex.

[73] Assignee: Texas Instruments Incorporated, Dallas, Tex.

[21] Appl. No.: 401,470

[22] Filed: Aug. 29, 1989

Related U.S. Application Data

[60] Division of Ser. No. 314,310, Feb. 22, 1989, abandoned, which is a continuation of Ser. No. 77,256, Jul. 24, 1987, abandoned.

[51] Int. Cl.$^5$ .................. H01L 21/76; H01L 21/265
[52] U.S. Cl. ........................... 437/43; 437/49; 437/195; 437/978
[58] Field of Search ............. 357/23.5; 437/43, 49, 437/52, 191, 193, 195, 978; 148/DIG. 43

[56] References Cited

U.S. PATENT DOCUMENTS

| | | | |
|---|---|---|---|
| 3,719,866 | 3/1973 | Naber et al. | 357/23.5 |
| 3,877,055 | 4/1975 | Fisher et al. | 357/23.5 |
| 4,385,308 | 5/1983 | Uchida | 357/23.5 |
| 4,611,308 | 9/1986 | Lonky | 357/41 |
| 4,654,828 | 3/1987 | Hagiwara et al. | 357/23.5 |
| 4,795,719 | 1/1989 | Eitan | 437/43 |

OTHER PUBLICATIONS

Chan et al., "A True Single-Transistor Oxide-Nitride-Oxide EEPROM Device" IEEEE Electron Device Letters, vol. EDL-8, No. 3, Mar. 1987, pp. 93-95.

Primary Examiner—Brian E. Hearn
Assistant Examiner—C. Chaudhari
Attorney, Agent, or Firm—Stanton C. Braden; Rene' E. Grossman; Richard L. Donaldson

[57] ABSTRACT

An electrically, programmable read-only memory cell is formed at a face (10) of a semiconductor layer (12). This cell comprises a doped drain region (36) and a doped source region (38) that are spaced from each other by a gate region (40). An ONO memory stack (28) is formed to extend over a portion of the gate region (40) that adjoins the drain region (36). The memory stack (28) is substantially spaced from the source region (38). A select gate insulator layer (30) is formed over the remainder of the gate region (40), and is preferably of the same thickness as the memory stack (28). A suitable gate conductor (32) is then deposited over insulator layers (26, 30). By being substantially spaced from source region (38), the memory stack (28) of the invention avoids the formation of ONO hole traps.

7 Claims, 1 Drawing Sheet

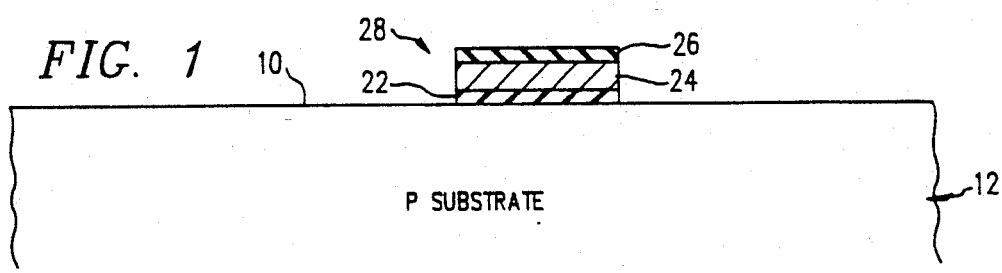
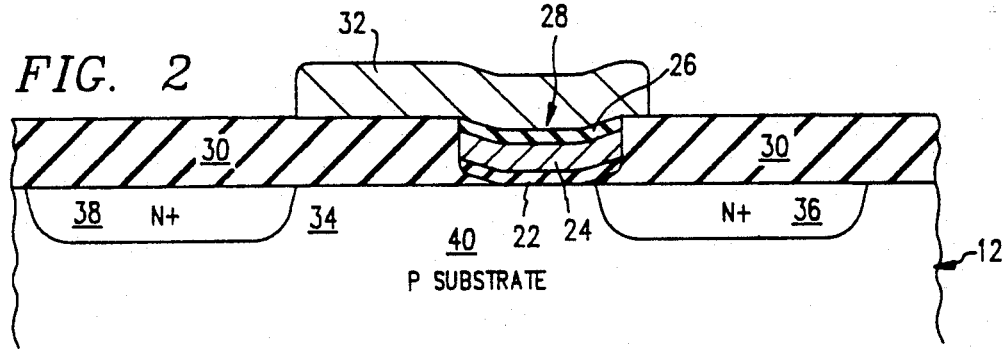
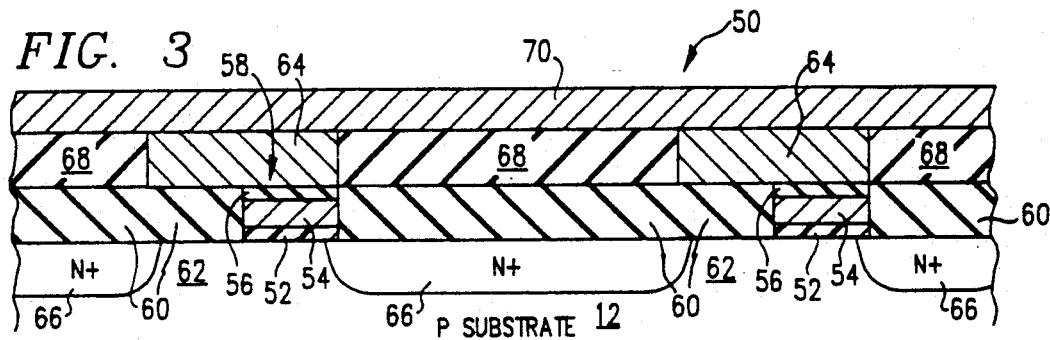
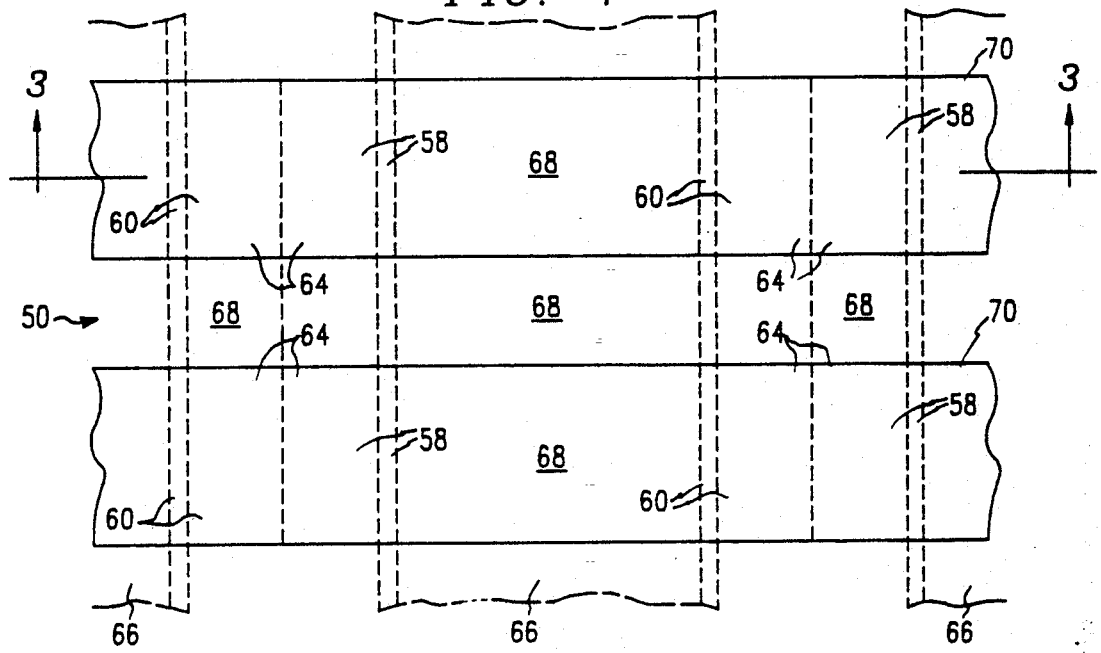

FABRICATING A SINGLE LEVEL MERGED EEPROM CELL HAVING AN ONO MEMORY STACK SUBSTANTIALLY SPACED FROM THE SOURCE REGION

This application is a division of application Ser. No. 07/314,310, now abandoned, filed Feb. 22, 1989, which is a continuation of application Ser. No. 07/077,256, now abandoned, filed Jul. 24, 1987.

TECHNICAL FIELD OF THE INVENTION

The present invention relates in general to erasable, electrically programmable read-only memories (EEPROMS) and relates more particularly to EEPROMS employing oxide/nitride/oxide constructions for their floating gate memory electrodes.

BACKGROUND OF THE INVENTION

It is known to construct EEPROM cells having oxide/nitride/oxide stacks that form floating gate electrodes. Typical of such recent EEPROM structures is that shown by T. Y. Chan, K. K. Young and C. Hu, "A True Single-Transistor Oxide-Nitride-Oxide EEPROM Device", *IEEE Electron Device Letters*, Vol pp. 93 et seq. (March, 1987). In this device, a source region and a drain region are formed in a semiconductor substrate, as separated by a gate region. An oxide-nitride-oxide sandwich layer is formed over the gate region to bridge the source and drain regions The memory is programmed by channel hot electron injection and the charges are stored in the oxide-nitride-oxide gate dielectric. The injection and storage of electrons and holes are confined to a short region near the drain. The portion of the channel near the source allegedly maintains the original positive threshold voltage, even after repeated erase operations. This construction obviates the need for a separate select transistor.

The above structure has, however, the disadvantage of introducing the possibility of oxide-nitride-oxide (ONO) traps near the source end of the cell. Were the nitride layer to store holes near the source end, the gate region would have a tendency to be rendered conductive across its length, as the threshold voltage would be lowered. This in turn could prevent the select transistor portion of the cell from ever turning off. Also, during read operations, if electron trapping were to occur near the source end, the gate region would have a tendency to be rendered nonconductive across its length, as the threshold voltage would be increased. This in turn could prevent the select transistor portion of the cell from ever turning on. Therefore, a need has arisen in the industry for an oxide-nitride-oxide integrated EEPROM structure that eliminates the possibility of such ONO traps.

SUMMARY OF THE INVENTION

One aspect of the present invention comprises an electrically programmable, read-only memory cell formed at a face of a semiconductor layer. A doped drain region is formed in the semiconductor layer, as spaced from a doped source region by a gate region. A first gate insulator layer is formed over a portion of the gate region adjacent the drain region. A floating gate dielectric electrode layer is formed on the first insulator layer, and a second gate insulator layer is formed on the floating gate electrode layer. A second portion of the gate region that is not covered by the first gate insulator layer has a third gate insulator layer formed on it so as to be adjacent the first layer, the floating gate electrode and the second insulator layer. Finally, a gate conductor layer is formed on the second and third gate insulator layers over the gate region.

Preferably, the floating gate electrode is formed of nitride and the first and second gate insulator layers are formed of oxide. It is preferred that each of the first and second gate insulator layers be approximately 40 to 100 angstroms thick, and the entire ONO memory stack be in the range of 230 to 350 angstroms thick. It is further preferred that approximately one half of the gate region be covered by the memory stack, which should be substantially spaced laterally from the source region. The third insulator layer is preferably formed to completely seal the nitride layer, thus preventing any charge leakage.

The present invention confers a principal advantage in that no ONO floating gate electrode structure is formed near the source region, and thus, no ONO traps near the source region are possible. The storage charge is however not reduced, since this is formed near the drain region in any event. A further advantage of the invention is obtained through the complete sealing of the nitride layer by the first, second and third insulator layers.

In another aspect of the invention, the above novel memory cell is incorporated into an array. In the array, a plurality of elongate doped source/drain regions are formed at a face of a semiconductor substrate. A plurality of gate regions are each formed in between pairs of the elongate source/drain regions in rows forming an angle to the source/drain regions and in columns parallel to the source/drain regions. For each of the gate regions, a thin insulator/floating gate electrode/thin insulator structure is formed over a portion of the gate region nearest a first doped region, with a third insulator layer being formed over a second portion of the gate region extending from the first portion to a second doped region. A first gate conductor layer is deposited on each third insulator layer and the adjoining second insulator layer. A thick insulator layer is formed over each elongate doped region and in between laterally adjacent first gate conductor layers. The combined thickness of the first gate conductor layer, and the third insulator layer is preferred to be approximately equal to the thick insulator layer. For each row, a second gate conductor layer is formed to couple each first gate conductor layer in the row.

Another aspect of the invention comprises a method for the formation of an electrically programmable read-only memory cell. According to the method, source and drain regions are formed at a face of a semiconductor layer as spaced by a gate region. Next, a first insulator layer is formed across the face. Next, a dielectric floating gate electrode layer is formed on the first insulator layer. A second insulator layer is then formed on top of the floating gate electrode layer.

The insulator and electrode layers are next patterned and etched in order to form a floating gate electrode that extends over only a portion of the gate region, the portion being substantially spaced from the source region. A gate conductor is then formed over the second and third insulator layers.

Another aspect of the invention comprises a method of reading stored information in the above EPROM. One of the doped regions is adjacent the ONO floating gate electrode layers, and the other doped region is laterally spaced therefrom by the third insulator layer. The first doped region, or nominal drain, is used for programming the memory stack by hot electron injection. However, it is preferred that the second region, nominally the source region, be used as the drain during normal read operations. This use of the second or nominal source region as the drain region for read operations reduces data loss.

BRIEF DESCRIPTION OF THE DRAWINGS

Other aspects of the invention and their advantages will be apparent from the following detailed description when taken in conjunction with the appended drawings in which:

FIG. 1 is a magnified cross sectional view of a semiconductor substrate showing beginning stages of formation of an erasable, electrically programmable read-only memory (EEPROM) cell according to the invention;

FIG. 2 is a magnified cross sectional view corresponding to FIG. 1, and showing a completed EEPROM cell according to the invention;

FIG. 3 is a magnified schematic sectional view of a planarized array incorporating an EEPROM cell according to the invention; and FIG. 4 is a plan view corresponding to the section of the planarized array shown in FIG. 3.

DETAILED DESCRIPTION

FIGS. 1 and 2 illustrate a pair of highly magnified schematic sectional views of an erasable, electrically programmable read only memory (EEPROM) at two stages in its fabrication. Referring particularly to FIG. 1, the EEPROM cell is preferably formed at a face 10 of a semiconductor substrate indicated generally at 12. In the illustrated embodiment, semiconductor substrate 12 is doped to be p-type.

According to a preferred process of the invention, a first insulator layer 22 is formed on face 10. Insulator layer 22 preferably is comprised of oxide, and it is preferred that layer 22 be thermally grown from semiconductor substrate 12. First insulator layer 22 should be approximately 40 to 100 angstroms in thickness, and a more preferred thickness is approximately 60 angstroms.

After layer 22 has been formed on face 10, a layer 24 of a material suitable for comprising a dielectric floating gate electrode is formed on the exposed surface of layer 22. Layer 24 preferably constitutes silicon nitride, and is preferably formed on layer 22 by a low-pressure chemical vapor deposition (LPCVD) process. Layer 24 should be approximately twice the thickness of thin insulator layer 22, and is preferably on the order of 200 angstroms in thickness.

After layer 24 has been deposited, a second thin insulator layer 26 is formed on the exposed surface of nitride layer 24. It is preferred that layer 26 be comprised of oxide, and in this instance its thickness should be in the range of 40 to 100 angstroms, with 60 angstroms being a more preferred thickness.

Layer 26 is preferably grown from layer 24 through a thermal steam sealing step. The combined thickness of layers 22, 24 and 26 will typically be on the order of 230 to 350 angstroms. In order to obtain the best characteristics of the fabricated device, it is important to carefully control the thicknesses of oxide layers 22 and 26.

After layers 22, 24 and 26 have been formed, they are patterned and etched in order to define a memory stack indicated generally at 28. As manufactured according to limits driven by current technology, stack 28 is approximately 0.75 microns wide. Layers 22, 24 and 26 may be etched with a conventional etchant such as $CF_4O_2$. While this etchant produces some undercutting, it is not significant where the described dimensions are employed. An anisotropic etch can also be employed where desired. It is preferred that a single etchant be used to etch through all three layers 22, 24 and 26, and that substrate 12, which is preferably formed of silicon, be resistant to this etchant.

Turning now to FIG. 2, the final steps in a fabrication process according to the invention are shown. After memory stack 28 has been deposited, patterned and etched, a relatively thick third gate insulator layer 30 is formed on the exposed surface 10 of semiconductor substrate 12. It is preferred that layer 30 be comprised of oxide, in which case it can be thermally grown from substrate 12. If layer 30 is grown by a thermal oxide process, the lateral edges of memory stack 28 will be slightly lifted as shown because of the oxide front, but this will not seriously affect the operational characteristics of the device.

Next, a gate conductor layer 32 is formed to extend over memory stack 28 and an adjoining region 34 in a semiconductor substrate. A preferred material for forming gate conductor layer 32 is polycrystalline silicon or "poly". Poly layer 32 is then patterned and etched in order to form the gate conductor 32 as shown. In the plane of the section shown, a preferred length of gate conductor 32 is approximately 1.7 microns, and one-half of the gate layer 32 should extend over memory stack 28.

The final step shown is the implantation of a nominal drain region 36 and a nominal source region 38. Drain region 36 and source region 38 are heavily doped to be of a conductivity type opposite to that of substrate 12. In the illustrated embodiment, drain 36 and source 38 are doped to be n+. Polysilicon gate 32 in the illustrated embodiment is used as a total or partial mask to self-register drain region 36 and source region 38.

The completed structure shown in FIG. 2 is that of a merged transistor and EEPROM memory cell. The nominal drain region 36 and the nominal source region 38 define the limits of a gate region 40 disposed between them. In the shown embodiment, gate region 40 is preferably dimensioned to be approximately 1.5 microns wide, with gate conductor layer 32 about 1.7 microns wide. Approximately one-half of gate region 40 is coupled to memory stack 28, with the remaining half 34 being covered by a select gate insulator layer 30. Memory stack 28 is formed so as to be substantially spaced from source region 38, such that undesirable ONO hole traps that are present in the select transistor of the prior art are eliminated. A principal advantage of the invention is therefore obtained in that there is less of a possibility that the select transistor of the EEPROM cell will be permanently turned on.

In operation, in order to program the cell with a binary bit of information, a high voltage such as nine volts is applied to drain region 36, and ten volts is applied to gate conductor 32. Zero volts is applied to source 38. This high voltage will cause hot electrons to be injected into nitride layer 24, thereby increasing the threshold voltage of the cell so that the cell is rendered permanently non-conductive at lesser voltages. It is preferred that the contents of memory stack 28 be read by applying a voltage to the nominal source region 38, the source region 38 in this instance acting as a drain. A much lesser voltage, such as five volts, is applied to region 38 in order to read the contents of the device. The use of region 38 for the drain during the normal read operation reduces data loss.

Turning now to FIG. 3, an embodiment of the invention is shown that is suitable to be incorporated into a planarized array. FIG. 3 is a highly magnified cross section of a planarized array, which is indicated generally at 50, and corresponds to section 3—3 of FIG. 4 to be described below. Array 50 is formed at the face of a semiconductor substrate 12, which in one embodiment is p-type. A first insulator layer 52, gate electrode layer 54 and second insulator layer 56 are formed, patterned and etched as previously described in order to form a plurality of columns of memory stacks each indicated generally at 58. Memory stacks 58 are formed so as to be in a plurality of columns as is shown in the plane view illustrated by FIG. 4. In FIG. 4, the longitudinal boundaries of memory stacks 58 are shown in phantom.

Thereafter, select gate insulator layer 60 is between columns of memory stacks 58. Memory stack 58 and gate insulator layer 60 are preferably approximately of the same thickness. Together, they completely overlap a respective gate region 62 of the semiconductor substrate.

After select gate transistor insulator layer 60 has been grown, a plurality of gate conductor layers 64 are deposited, patterned and etched into longitudinal strips so as to be formed over each gate region 62 in the array. As existing in longitudinal strips before a subsequent etch step, the preferably poly gate conductors 64 can be used to self-register a plurality of elongate source/drain regions 66, which are formed in substrate 12 preferably by an implantation step, and are relatively heavily doped to be of a conductivity type opposite to that of substrate 12. Due to dopant diffusion, source/drain regions 66 will extend slightly under select gate insulator layers 60 and memory stacks 58.

As best shown in FIG. 4, after the self aligned implantation step for the sources/drains 66, the surrounding areas are filled with a thick insulator layer 68 that extends over the exposed portions of source/drain regions 66. It is preferred that layer 68 be constituted of oxide and be of approximately the same thickness as the combined thickness of poly gate conductor 64 and memory stack 58, or poly gate 64 and select gate insulator 60.

Up to this point, the array presents a relatively planar surface with a simple topography. In the final step illustrated, a plurality of second, horizontal polysilicon conductors 70 are deposited, patterned and etched so as to cross source/drain regions 66. Then the columns of gate conductors 64 are etched using the same pattern photoresist that is used to form polysilicon conductors 70. This forms a plurality of rectangular gate conductors 64. Each second conductor strip 70 is therefore formed so as to contact each first poly gate conductor 64 in a respective row.

In the completely fabricated array, source/drain regions form parallel bit lines, and second poly conductors 68 form word lines. The memory cells are formed at the intersection of each word line and each bit line.

In summary, an improved single-level, erasable, electrically programmable read only memory cell has been shown and described. The EEPROM of the invention comprises a memory stack that extends only over that portion of the gate region that is closest to the program drain region of the cell. The memory stack is substantially spaced from the program source region of the cell, such that undesirable ONO traps are not formed during programming or operation. The improved EEPROM cell of the invention can be employed in conventional integrated circuits or can be incorporated into a planarized array as shown.

While preferred embodiments and their advantages have been shown and described in the above detailed description, the invention is not limited thereto, but only by the spirit and scope of the appended claims.

What is claimed is:

1. A method for manufacturing an electrically programmable read-only memory cell formed at a face of a semiconductor layer, comprising the steps:

forming a first gate insulator layer over said semiconductor substrate;

forming a dielectric floating gate electrode layer over said first gate insulator layer;

forming a second gate insulator layer over said floating gate electrode layer;

patterning and etching the first gate insulator layer, the floating gate electrode, and the second gate insulator layer to form a memory stack;

forming a third insulator layer on said semiconductor layer adjoining said memory stack, said third insulator layer relatively thick with respect to said first and second insulator layer;

forming gate conductor on the second and third insulator layers over a gate region in the semiconductor layer;

forming a doped drain region in the semiconductor layer adjacent the gate region and the memory stack and self-aligned on at least one edge to said gate conductor; and forming a doped source region in the semiconductor layer adjacent the gate region, spaced from the memory stack, and self-aligned on at least one edge to said gate conductor.

2. The method of claim 1, and further including the step of:

simultaneously etching the first gate insulator layer, the floating gate electrode layer and the third gate insulator layer in a single etch step.

3. The method of claim 1, and further including the step of forming the third insulator layer to be approximately as thick as the combined thicknesses of the first and second gate insulator layers and the gate electrode layer.

4. The method of claim 1, and further including the step of forming the first insulator layer by a thermal oxide step.

5. The method of claim 1, and further including the step of forming the second insulator layer by means of a thermal steam seal step.

6. The method of claim 1, and further including the step of forming the dielectric gate electrode layer from silicon nitride.

7. The method of claim 6, and further including the step of depositing the dielectric gate electrode layer by low pressure chemical vapor deposition.

* * * * *